US009400953B1

(12) United States Patent
Choi et al.

(10) Patent No.: US 9,400,953 B1
(45) Date of Patent: Jul. 26, 2016

(54) LASER PROCESSING ENABLING RADIO FREQUENCY IDENTIFICATION (RFID) CUSTOMIZATION

(71) Applicant: Thin Film Electronics ASA, Oslo (NO)

(72) Inventors: Criswell Choi, Menlo Park, CA (US); Joerg Rockenberger, Tahoma, CA (US); Christopher Gudeman, Lompoc, CA (US); J. Devin Mackenzie, San Carlos, CA (US); Partick Smith, San Jose, CA (US); James Montague Cleeves, Redwood City, CA (US)

(73) Assignee: Thin Film Electronics ASA, Oslo (NO)

( * ) Notice: Subject to any disclaimer, the term of this patent is extended or adjusted under 35 U.S.C. 154(b) by 217 days.

(21) Appl. No.: 14/285,469

(22) Filed: May 22, 2014

Related U.S. Application Data

(62) Division of application No. 11/595,839, filed on Nov. 8, 2006, now Pat. No. 8,758,982.

(60) Provisional application No. 60/748,974, filed on Dec. 7, 2005.

(51) Int. Cl.
| | |
|---|---|
| *G03F 7/00* | (2006.01) |
| *G01S 13/74* | (2006.01) |
| *G06K 19/077* | (2006.01) |
| *G08B 13/24* | (2006.01) |

(52) U.S. Cl.
CPC .... *G06K 19/07773* (2013.01); *G06K 19/07749* (2013.01); *G08B 13/2402* (2013.01); *G08B 13/2417* (2013.01); *G08B 13/2468* (2013.01)

(58) Field of Classification Search
CPC ........... G08B 13/2402; G08B 13/2417; G08B 13/2468; G06K 19/07749; G06K 19/07773
USPC .......................... 430/311, 317, 319; 235/380; 455/FOR. 251; 342/44
See application file for complete search history.

(56) References Cited

U.S. PATENT DOCUMENTS

| | | | |
|---|---|---|---|
| 4,746,830 | A | 5/1988 | Holland |
| 5,521,601 | A | 5/1996 | Kandlur et al. |
| 5,550,547 | A | 8/1996 | Chan et al. |
| 5,855,969 | A | 1/1999 | Robertson |
| 7,259,100 | B2 | 8/2007 | Zurcher et al. |
| 2006/0141391 | A1 | 6/2006 | Klein et al. |
| 2007/0007342 | A1 | 1/2007 | Cleeves et al. |
| 2007/0199071 | A1 | 8/2007 | Callas |
| 2008/0044964 | A1 | 2/2008 | Kamath et al. |

*Primary Examiner* — Thorl Chea
(74) *Attorney, Agent, or Firm* — Andrew D. Fortney; Central California IP Group, P.C.

(57) ABSTRACT

Methods, algorithms, processes, circuits, and/or structures for laser patterning suitable for customized RFID designs are disclosed. In one embodiment, a method of laser patterning of an identification device can include the steps of: (i) depositing a patternable resist formulation on a substrate having configurable elements and/or materials thereon; (ii) irradiating the resist formulation with a laser tool sufficiently to change the solubility characteristics of the resist in a developer; and (iii) developing exposed areas of the resist using the developer. Embodiments of the present invention can advantageously provide a relatively low cost and high throughput approach for customized RFID devices.

18 Claims, 11 Drawing Sheets

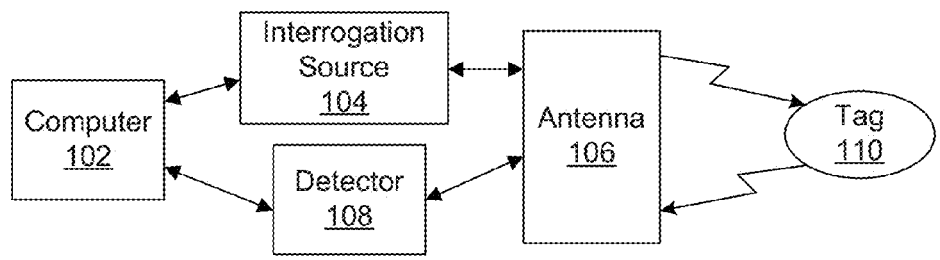
FIG. 1 (conventional)
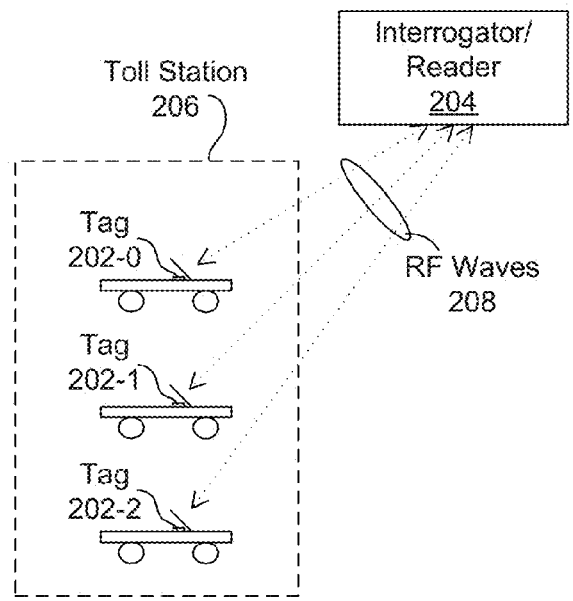
FIG. 2 (conventional)

LASER PROCESSING ENABLING RADIO FREQUENCY IDENTIFICATION (RFID) CUSTOMIZATION

RELATED APPLICATIONS

This application is a divisional of U.S. patent application Ser. No. 11/595,839, filed Nov. 8, 2006, which claims the benefit of U.S. Provisional Application No. 60/748,974, filed Dec. 7, 2005, each of which are incorporated herein by reference in their entireties.

FIELD OF THE INVENTION

The present invention generally relates to the field of electronic article surveillance (EAS), radio frequency (RF) and/or RF identification (RFID) tags and devices. More specifically, embodiments of the present invention pertain to EAS, RF and/or RFID structures and methods of manufacture, production, and/or customization.

DISCUSSION OF THE BACKGROUND

Low cost RFID systems, typically including an interrogator or "reader" and an electronic label or "tag," are desirable in a variety of applications, such as retail, supply chain management, logistics, library management, anti-counterfeiting, access control, and baggage claim systems, as just a few examples. Other emerging applications include vehicle toll tracking and/or management. One advantage of RFID systems over conventional barcode and magnetic media-based systems is that RFID systems can be configured to read multiple electronic labels simultaneously. Such a multi-tag capability can enable faster automated data capture and identification, leading to faster and more efficient inventory tracking, sorting, and handling operations, for example.

Referring now to FIG. 1, a block diagram showing a conventional RFID tag system for a single tag application is indicated by the general reference character 100. Computer 102 can connect to interrogation source or reader 104, which can then communicate to tag 110 via antenna 106. Tag 110 can provide information wirelessly to antenna 106 that can then be captured by detector 108 and fed back into computer 102. Tag 110 can, for example, provide a simple bit string of data back to computer 102. For example, in a retail application, tag 110 can convey to computer 102 whether a particular item has been purchased or not.

In expanding typical RFID systems to support multi-tag read capability, anti-collision blocks and/or algorithms can be employed with the interrogator and electronic label or tag device. Two common anti-collision schemes are "tags-talk-first" (TTF) and "reader-talks-first" (RTF). In a TTF approach, the electronic label can reply intermittently as long as it is within a sustained electromagnetic field of the interrogator. This field must be maintained for a period of time greater than a time interval between the intermittently repeated label replies. In an RTF scheme, the interrogator and an electronic label to be read must set up a communication link whereby the electronic label can decode and transmit based on commands and arbitration schemes from the interrogator.

Referring now to FIG. 2, a diagram showing a conventional tag system application for reading multiple tags simultaneously is indicated by the general reference character 200. Toll station 206 can employ a tag system to determine whether cars passing through have arranged for payment (e.g., via a debit or a credit account) to access a road, as an alternative to each car stopping in order to pay a person in a booth at the toll station. Each car passing through may have an associated tag attached to the vehicle (e.g., tags 202-0, 202-1, and 202-2). An applied electromagnetic field can include RF waves 208 to pass information between interrogator/reader (or source/detector) 204 and each of tags 202-0, 202-1, and 202-2. Other such multi-tag read applications include retail, library or inventory management, security, and animal (e.g., pet) identification, for example.

Customization of RFID tags at the integrated circuit (IC) level to embed unique identifiers and/or response characteristics is of high value for retail item level applications (e.g., inventory control, cashier check out, anti-counterfeiting, etc.) or applications with relatively low demands for anti-collision (e.g., library checkout, transit ticket management, etc.). For example, one type of embedded unique identifier is a bar code. An example of embedded unique response characteristics may be found in certain "tags-talk-first" (TTF) anti-collision schemes (see, e.g., U.S. Provisional Patent Appl. No. 60/748,973 [IDR0641], filed on Dec. 7, 2005, and U.S. patent application Ser. No. 11/544,366 [IDR0642], filed on Oct. 6, 2006, the relevant portions of which are incorporated herein by reference, which disclose a technique for embedding unique time delays in tag broadcasts). There are several conventional approaches to incorporating customization by encoding bits in memory, such as those utilizing read-only memory (ROM), one-time programmable (OTP) fuses, and electrically-erasable programmable ROM (EEPROM) elements.

In making ROM elements, the unique ID information may be conventionally encoded in the lithography masks. The cost of mask implementation may be proportional to the number of mask sets required, which can be proportional to the number of unique patterns desired. However, for RFID applications, the relatively large number of unique IDs needed makes mask encoding for this type of customization prohibitively expensive.

OTP fuses offer a high degree of customization, but are limited by the programming requirements. For example, laser programming by blowing select fuses may be limited by the applied laser power, which depends on the line width of the fuse. For thin film transistor (TFT) designs with line widths larger than 2 µm, the power required may be so high that the throughput of conventional laser fuse tools may not be cost effective for RFID devices. Similarly, the limited power available in certain RF applications may restrict the ability to blow select fuses by passing a high current through them.

EEPROM elements are relatively easy to program, but conventional EEPROM elements may have manufacturing process challenges and/or costs that make them a less-than-optimal solution for RFID applications.

An alternative approach to customization utilizes maskless patterning techniques, as they offer high degrees of customization and can be quickly adapted to various applications by changing software parameters. Examples of maskless patterning techniques include laser patterning and inkjetting, using metal nanoparticle- and/or liquid silane-based inks (see, e.g., Kovio U.S. Provisional Pat. Appl. No. 60/697,599 [filed Jul. 8, 2005] and U.S. patent application Ser. Nos. 11/249,167, 11/246,014, 11/243,460, 11/203,563, 11/104,375, 11/084,448, 10/956,714, 10/950,373, 10/949,013, 10/885,283, 10/789,317, 10/749,876, and/or 10/722,255, respectively filed on Oct. 11, 2005, Oct. 6, 2005, Oct. 3, 2005, Aug. 11, 2005, Apr. 11, 2005, Mar. 18, 2005, Oct. 1, 2004, Sep. 24, 2004, Sep. 24, 2004, Jul. 6, 2004, Feb. 27, 2004, Dec. 31, 2003 and Nov. 24, 2003).

However, for certain high performance applications, laser patterning may be preferable to inkjetting because current laser patterning technology can offer higher patterning resolutions. What is needed, however, is a laser patterning process suitable for high performance RFID implementations.

SUMMARY OF THE INVENTION

Embodiments of the present invention relate to methods, algorithms, processes, circuits, and/or structures for laser patterning suitable for customized electronic article surveillance (EAS), radio frequency (RF) and/or RF identification (RFID) designs, as well as other applications that may benefit from or require customization.

In one embodiment, a method of laser patterning of an identification device can include: (i) depositing a laser-patternable resist on a substrate containing configurable elements and/or layers thereon; (ii) irradiating the patternable resist with a laser tool sufficiently to change the solubility characteristics of the patternable resist in a developer; and (iii) developing areas of the patternable resist using the developer. In various embodiments, the resist may comprise a polyimide and may further include a light-absorbing dye (e.g., a dye that absorbs certain wavelengths of bands of infrared [IR] light).

In another embodiment, a method of customizing identification devices can include: (a) forming a pattern on one of the identification devices using laser patterning; (b) forming a different pattern on another of the identification devices using laser patterning; and (c) repeating step (b) such that at least a majority (and in one implementation, each) of the identification devices contains a unique identifier. The customized patterns can be formed in any layer of the device, such as metal (e.g., aluminum), semiconductor (e.g., silicon) and/or insulator (e.g., via patterns) layers, for example. Further, the unique identifier can also include a local key (e.g., a bit string or signal/response pattern) for security or encryption features. Thus, another embodiment of the invention concerns a plurality of identification devices, each having a unique pattern thereon, where the unique pattern may be configured to provide a unique identifier and/or a signal pattern.

Embodiments of the present invention can advantageously provide a relatively low cost and high throughput approach for customized RFID devices. Further, embodiments of the present invention can advantageously be implemented using laser patterning technology. These and other advantages of the present invention will become readily apparent from the detailed description of preferred embodiments below.

BRIEF DESCRIPTION OF THE DRAWINGS

FIG. 1 is a block diagram showing a conventional RF identification (RFID) tag system for a single tag application.

FIG. 2 is a diagram showing a conventional tag system application for reading multiple tags simultaneously.

DETAILED DESCRIPTION OF THE PREFERRED EMBODIMENTS

Figure 3:
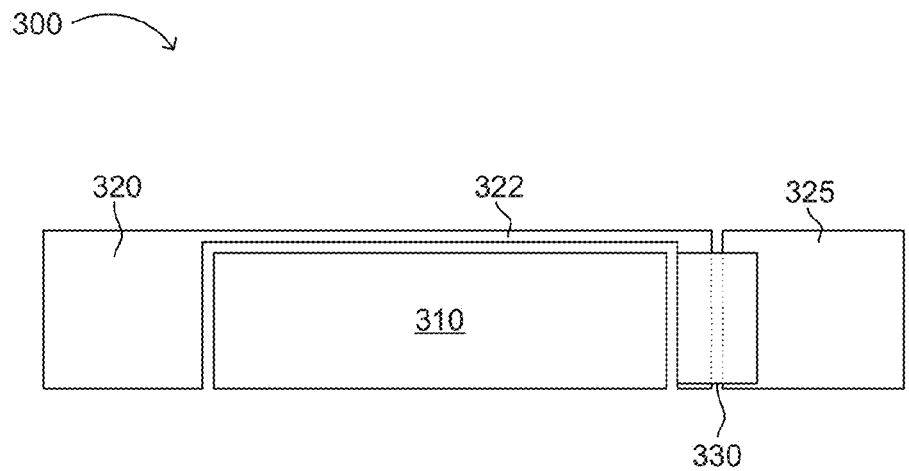
FIG. 3 is a layout diagram showing an exemplary tag device layout suitable for use in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "operating," "computing," "calculating," "determining," or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. Similarly, for convenience and simplicity, the terms "data," "data stream," "waveform" and "information" may be used interchangeably, as may the terms "connected to," "coupled with," "coupled to," and "in communication with," (which may refer to direct or indirect connections, couplings, or communications) but these terms are generally given their art-recognized meanings herein.

Embodiments of the present invention relate to methods, algorithms, processes, circuits, and/or structures for laser patterning suitable for customized RFID designs. For example, a method of laser patterning of an identification device can include the steps of: (i) depositing a laser-patternable resist on a substrate having configurable elements and/or materials thereon; (ii) irradiating the patternable resist with a laser tool sufficiently to change the solubility characteristics of the patternable resist in a developer; and (iii) developing areas of the patternable resist using the developer.

In another aspect of the invention, a method and/or process of customizing identification devices can include the steps of: (a) forming a pattern on one of the identification devices using laser patterning; (b) forming a different pattern on another of the identification devices using laser patterning; and (c) repeating step (b) such that at least a majority (and in one implementation, each) of the identification devices contains a unique identifier. The patterns can include metal (e.g., aluminum), semiconductor (e.g., silicon and/or germanium) and/or via patterns, for example. Further, the unique identifier can also include or encode a bit string or signal pattern, enabling formation of a local key for security or encryption features. Thus, the invention may also concern a plurality of identification devices, each having a unique identification or signal pattern, where the unique pattern may be configured to provide a unique identifier, a unique reader response time and/or a local key.

The invention further relates to hardware implementations of the present architecture, method and circuit. Embodiments of the present invention can advantageously provide a relatively low cost and high throughput approach for customized RFID devices. Further, embodiments of the present invention can advantageously be implemented using laser patterning technology. The invention, in its various aspects, will be explained in greater detail below with regard to exemplary embodiments.

According to various embodiments of the present invention, a laser patterning approach for customizing RFID tags can include changing a digital exposure pattern from tag to tag, for an individual tag or a group of tags. Further, suitable laser exposure tools include low cost, high throughput patterning tools such as those used in computer-to-plate (CTP) applications in the graphics arts printing industry, for example. A suitable wavelength of laser radiation can range from ~400 nm (violet) to ~1100 nm (IR), for example. Embodiments of the present invention are particularly suitable for customizable RFID tags having unique IDs, unique reader response times and/or security or encryption features encoded thereon. However, in most applications, a specific identifier or security feature can be used again for an individual tag in a different group of tags, where the probability approaches zero that the tags having the same identifier will interact with the same reader/detector at the same time. Algorithms for determining acceptable probabilities of such "same tag" interference, and for configuring groups of tags that comply with such probabilities, are known to those skilled in the art.

In general, a printed circuit in accordance with embodiments of the present invention can include: an antenna section, a power-up circuit, a clock subcircuit, a counter, a memory or memory array, a decoder, a loop reset circuit, and an output circuit (e.g., an output buffer or driver). All such circuits or portions thereof can be printable or laser patterned in order to reduce overall system costs. Further, "on-the-fly" customization of individual tags during the manufacturing process can also be accommodated.

An RFID tag or device made in accordance with embodiments of the present invention can generally have operating steps including: (i) after initial power-up, transmitting a bit string (which may have been laser-programmed into memory); (ii) silencing the tag for a predetermined period of time (this length of time may also have been laser-programmed into memory); and (iii) re-broadcasting the bit string. Generally, the process of bit string transmission, silencing, and re-transmission of the bit string, can continue so long as the tag receives power (e.g., a suitable electromagnetic field remains applied).

Exemplary RFID Tag Structures

Exemplary RFID tags, structures, circuits and/or devices can generally include various structural and/or functional blocks, such as: (i) antennae; (ii) RF-to-DC conversion circuitry; (iii) demodulation circuitry for demodulating clock and data signals; (iv) logic to perform control and readout (I/O) functions; (v) memory; and (vi) modulation circuitry for modulating a transmission (e.g., an output signal or broadcast) from the tag. Specific examples involving these and other functional blocks and layout arrangements will be discussed in more detail below.

FIG. 3 shows an exemplary layout for tag/device 300, including logic region 310, antenna regions 320 and 325, and charge pump area 330. The device 300 may have a length of from 1 to 40 mm, preferably 2 to 20 mm, a width of from 1 to 40 mm, preferably 5 to 20 mm, and an overall area of from 1 to 100 mm$^2$, preferably 10 to 50 mm$^2$. In one example, the device is 2 mm×12.5 mm. Alternatively, the device may have a substantially square shape, and may further include an anisotropic conductive polymer (ACP) or other adhesive thereon and/or thereunder for affixing it to an antenna. As will be discussed in more detail with regard to FIGS. 4A-4B, logic region 310 may further comprise an input/output control portion, a memory or information storage portion, a clock recovery portion, and/or an information/signal modulation portion.

Antenna region 320 is coupled to charge pump region 330 by L-shaped bus 322. A part of charge pump region 330 also overlaps with antenna region 325. Charge pump region 330 is conventionally coupled to antenna regions 320 and 325 by capacitors, diodes and/or interconnects. For example, charge pump region 330 may comprise a plurality of stages (in one specific example, 8 stages), and the capacitors therein may have an area of 100 to 400 square microns per antenna overlap portion (i.e., the portion of charge pump 330 that overlaps with either bus 322 or antenna region 325).

Figure 4A:
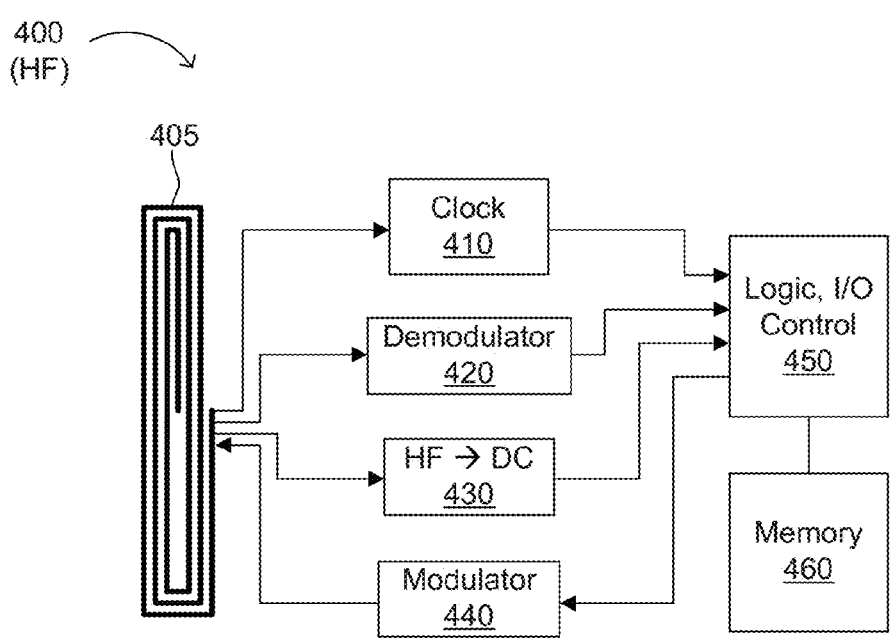
FIG. 4A is an exemplary block schematic diagram showing an HF tag design suitable for use in accordance with embodiments of the present invention.
Figure 4B:
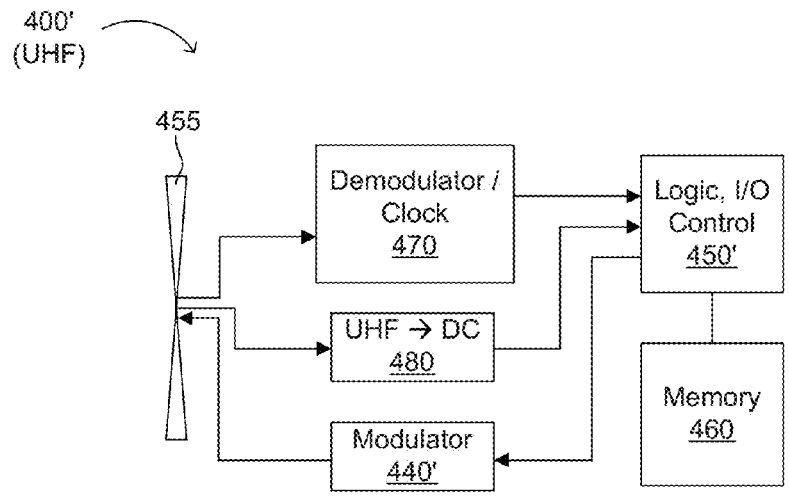
FIG. 4B is an exemplary block schematic diagram showing a UHF tag design suitable for use in accordance with embodiments of the present invention.

A block diagram of a high frequency (HF) range tag design is shown in FIG. 4A (general reference character 400) and an ultra-high frequency (UHF) range tag design is shown in FIG. 4B (general reference character 400'). The HF tag design (400) comprises antenna 405, clock/clock recovery block 410, demodulator block 420, HF-DC converter block 430, modulator block 440, logic and I/O control block 450, and memory 460. The UHF tag design (400') comprises dipole antenna 455, demodulator/clock recovery block 470, UHF-DC converter block 480, modulator block 440', logic and I/O control block 450', and memory 460. Clock recovery block 410 may operate at or near the carrier frequency, and therefore, advantageously includes high speed devices. Antennae 405 and 455, and busses from the antennae to demodulator blocks 420 and 470 and to power converter blocks 430 and 480 may also carry signals at or near the carrier frequency, and therefore, advantageously include materials capable of and/or configured for high speed signal transmission(s).

The antennae structures at HF are most inexpensively implemented as a planar spiral inductor coil with a resonant tank capacitor coupled thereto (e.g., in charge pump region 330 in FIG. 3). The use of a metal foil as a substrate, or a thick printed conductive film on a more conventional substrate (such as a thin glass sheet, a stiff or flexible plastic, a conventional prepreg laminate, a flexible high temperature polyimide, etc.) provides advantageously low resistivity for high quality (e.g., high voltage/power extracting) LC coils. However, the substrate generally comprises an electrically active substrate, having one or more predetermined electrical properties and/or functions, such as signal transmission and/or reception (particularly at or in a predetermined frequency range), charge storage (e.g., as one or more capacitor electrodes), signal switching, rectification and/or filtering, etc. Preferably, the substrate has one or more electrically conducting and/or semiconducting properties. In the UHF, the antenna is typically in a full or half-wave dipole or dipole-derivative form that supports transmission (and reception) of AC waves without significant DC conduction or long conduction distances as in a coil. Also, the skin depth of the excitation in the antennae is shallower in the UHF. For that reason, UHF antennae can be thin metal foils or even printed conductor films from materials such as Ag pastes. In certain design embodiments, the HF or UHF antennae could be formed directly in the underlying metal substrate for the integrated circuitry, or the substrate could form an interposer or strap (e.g., a thin plastic or glass sheet serving as a substrate for subsequent formation of silicon-based devices) of intermediate size (e.g., between that of the full antennae and that of the semiconductor device-containing integrated circuit area) that could then be attached to an external antenna.

RF-to-DC conversion can be achieved using rectifiers (typically in a voltage doubler configuration), or thin film diode structures at UHF or HF. It may also be possible to achieve RF-to-DC conversion with diode-connected TFTs (i.e., having its gate connected to a source or drain of the same transistor), as long as the diode-connected TFTs have sufficient performance characteristics (e.g., as defined by gate delays and/or carrier mobilities). Modeling of thin film devices containing one or more films formed from a silicon-based ink with mobilities of >10 cm$^2$/vs in the diode transport direction, doping in the range of $10^{17}$-$10^{20}$ cm$^{-3}$, and contact resistances on the order of $10^{-5}$ ohm-cm$^2$ may be able to support rectification in the GHz regime, of sufficient efficiency to power an RFID circuit. GHz rectification of an RF signal to DC power and <2 nsec gate delays have been demonstrated experimentally for a vertical thin film diode structure and for a self-aligned TFT structure, respectively, formed using a silicon ink as described herein and/or in one or more co-pending U.S. patent applications cited herein.

Demodulation of clock and data signals, encoded as a subcarrier or subcarrier modulation on the carrier RF signal, can be achieved with simple voltage detectors based on thin film diodes or diode connected TFTs as described elsewhere herein. Optimal signal extraction may require filtering and the use of tuned capacitors.

Logic to perform the required control and readout (I/O) functions can be realized with TFTs in CMOS or NMOS technologies, using materials as described herein. CMOS devices have a significant advantage in terms of power efficiency, but may require additional process steps and/or materials, or more complex processing equipment, as compared to NMOS devices alone.

In the HF range, modulation is typically done by load modulation with a shunt transistor in parallel with a resonant capacitor. With a modulator TFT in enhancement mode, when the transistor is on, the LC coil that forms the tag's antenna is shorted. This dramatically reduces the Q of the circuit and the coupling to the reader coil. When the TFT is switched sufficiently 'off,' the Q of the LC coil is restored. In this way, a modulation signal can be passed from the tag to the reader. At UHF, similar effects also vary the scattering cross-section of the antenna and modulate the backscatter signal to the reader. This can be done with load modulation TFTs changing the impedance of the antenna, and therefore, the backscatter signal. Due to potential power losses, it may be advantageous to use a varactor-based modulation that shifts the imaginary part of the impedance (or reactance) of the UHF antennae using either a MOS capacitor device or a varactor diode that can be formed using the TFT and diode processes described herein for logic TFTs and for rectifier and/or demodulator diodes.

Typically, RFID tag operation is limited by the minimum RF field (and power) required to power the tag. Once the tag is able to power-up and sustain the required voltages, tag-to-reader communications are possible.

Figure 5:
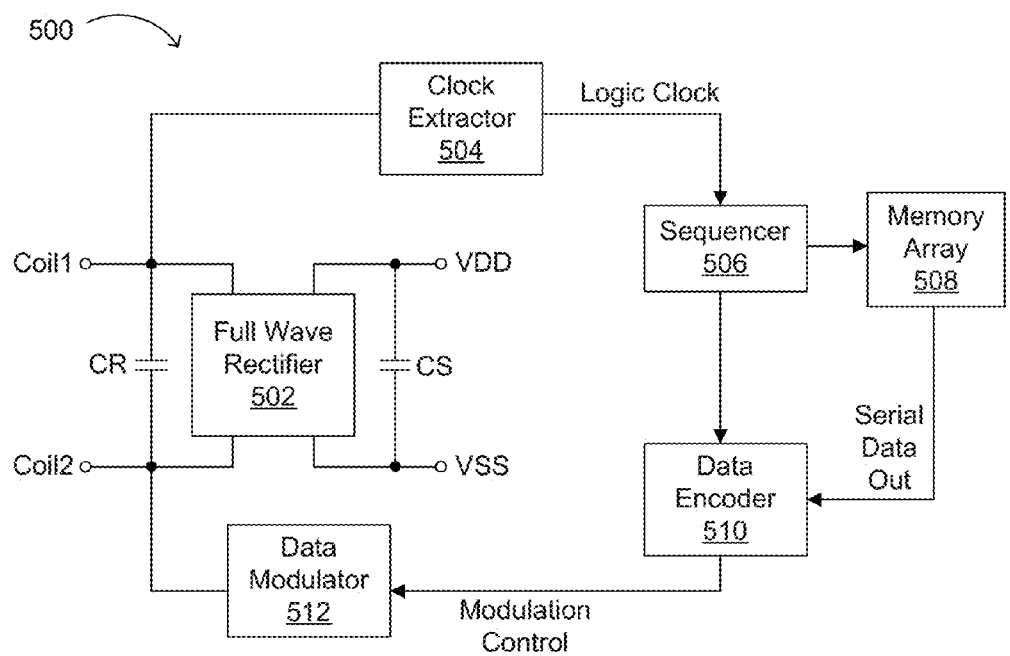
FIG. 5 is an exemplary block schematic diagram showing an RFID design suitable for use in accordance with embodiments of the present invention.

Referring now to FIG. 5, an exemplary block schematic diagram showing an RFID design suitable for use in accordance with embodiments of the present invention is indicated by the general reference character 500. An electromagnetic field can be induced by an external coil attached at terminals Coil1 and Coil2 and across capacitor CR. The AC voltage across the coil can be rectified by full wave rectifier 502 to form a DC supply across terminals VDD/VSS and supply capacitance, CS.

Clock extractor 504 can produce a logic clock for sequencer 506. Memory array 508 can be accessed by signals generated from sequencer 506 to provide serial data out to data encoder 510. Modulation control can be generated from data encoder 510 and provided to data modulator 512 for output to the reader.

Laser patterning for customization of such RFID tags in accordance with embodiments of the present invention can include: (i) laser resist patterning (and, typically, etching of one or more exposed underlying layers); (ii) laser patterning of interlayer dielectrics; and/or (iii) laser direct-writing of metal gate and/or interconnect layers. Exemplary methods and/or fabrication processes for each will be discussed in turn below.

An Exemplary Method of Laser Resist Patterning

An exemplary method of laser patterning of an identification device in accordance with embodiments of the present invention can include the steps of: (i) depositing a laser-patternable resist on a substrate containing configurable elements and/or materials; (ii) irradiating the patternable resist with a laser tool sufficiently to change the solubility characteristics of the patternable resist in a developer; and (iii) developing areas of the patternable resist using the developer. In various embodiments, the laser-patternable resist comprises a conventional photoresist and a light-absorbing dye (e.g., a dye adapted to selectively absorb certain wavelengths or bands of visible [e.g., from about 400 nm] or infrared light), or a polyimide adapted to selectively absorb certain wavelengths or bands of visible or infrared light.

Figure 6:
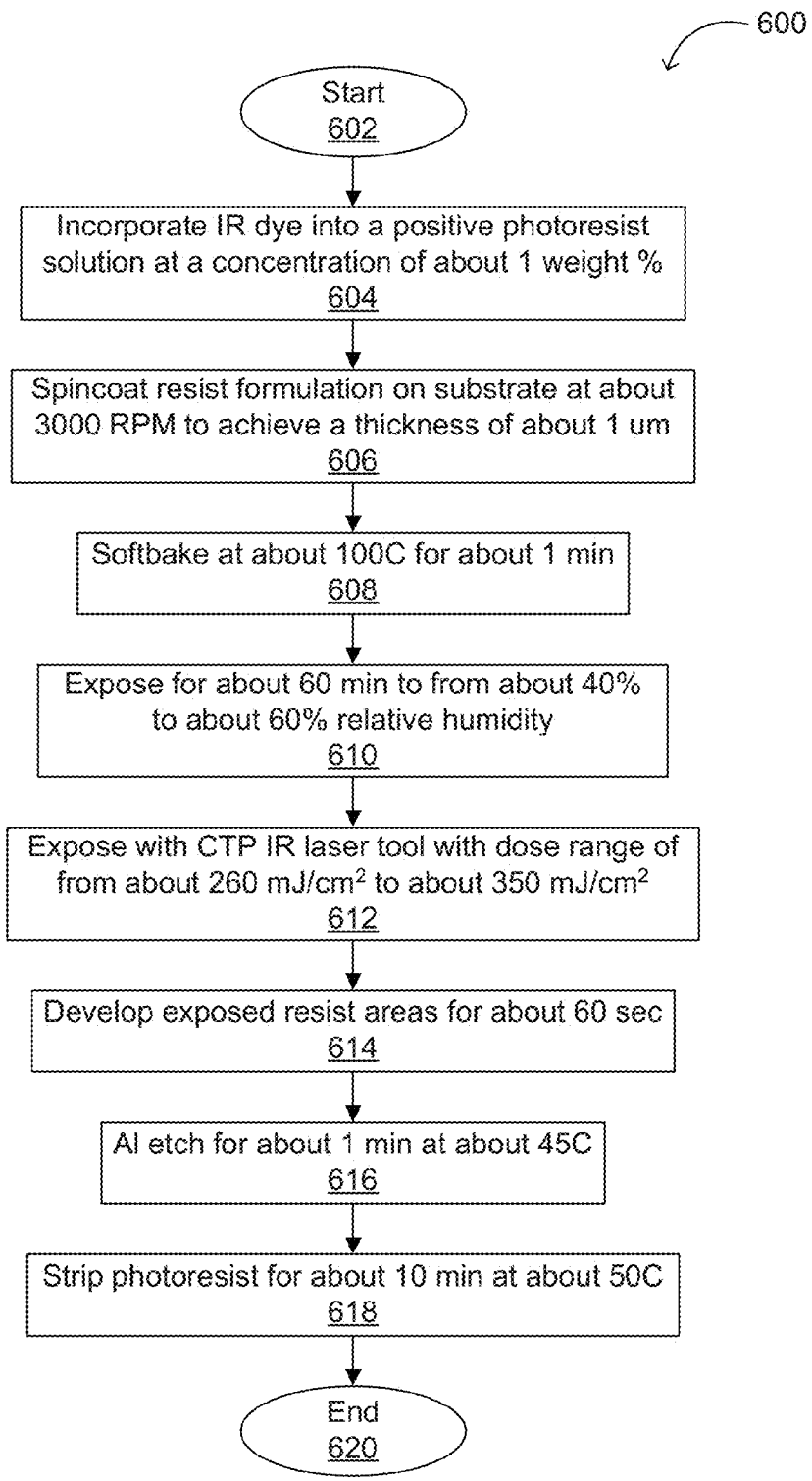
FIG. 6 is a flow diagram showing an exemplary method of laser resist patterning in accordance with embodiments of the present invention.

Referring now to FIG. 6, a flow diagram showing an exemplary method of laser resist patterning in accordance with embodiments of the present invention is indicated by the general reference character 600. In this example, the substrate has a metal, semiconductor or a dielectric film thereon, to be patterned according to the invention. In various embodiments, the film has a thickness of from 100 Å to 8000 Å. For example, a metal film may comprise aluminum and have a thickness of from 150 Å to 3000 Å (e.g., about 2000 Å). A semiconductor film may comprise silicon and have a thickness of from 250 Å to 2000 Å (e.g., about 50 nm). A dielectric film may comprise a silicon oxide and have a thickness of from 100 Å to 8000 Å (e.g., about 500 nm).

The flow can begin (602) and, optionally, a dye absorbing at the laser wavelength (e.g., in the infrared [IR] range of the light spectrum) can be incorporated into a solution containing a conventional photoresist at a concentration of from 0.1 to 10 wt. %, and in one embodiment, about 1 weight % (604), to make a laser patternable resist formulation. In the particular example utilizing an IR laser, an infrared absorbing dye may be added to the photoresist solution. Such an IR dye can be obtained from American Dye Source (e.g., ADS815E) and the photoresist can be a novolak photoresist from AZ Electronic Materials (e.g., AZ1518), for example. Next, the resist formulation can be spincoated on a substrate at a rate of from 500 to 5000 RPM, and in one embodiment, about 3000 RPM, to form a laser patternable resist coating. This coating may have a thickness of from 0.2 µm to 3 µm, and in one embodiment, about 1 µm (606). Next, the structure can be heated at a temperature and for a length of time sufficient to remove substantially all of the solvent from the resist coating (a so-called "softbake" process) (608). The temperature may be from about 80 to about 130° C., and in one embodiment, at about 100° C., for 15 seconds to about 5 minutes (in one example, about 1 minute). Next (and optionally), the softbaked coating can be exposed for 10-120 minutes (in one example, about 60 minutes) to a relative humidity of from about 20% to 80% (e.g., from about 40% to about 60%) (610).

Next, the resist coating can be irradiated (exposed) with a laser tool capable of changing the solubility characteristics of the photoresist film (optionally with added dye) in the exposed areas. Preferably, the laser tool comprises a high throughput laser patterning tool, for example as employed by the graphics art industry in computer-to-plate (CTP) applications. The wavelength employed may vary from 400-1100 nm. In one particular example, a CTP IR laser tool may be used to expose a photoresist with added IR dye with a dose of radiation ranging from 150 mJ/cm$^2$ to 500 mJ/cm$^2$ (e.g., from about 260 mJ/cm$^2$ to about 350 mJ/cm$^2$) (612). Then, the exposed resist areas can be developed for 30 to 90 seconds, and in one embodiment, about 60 seconds (614). The developer used can be a conventional KOH or TMAH-based developer (e.g., 0.23M), available from AZ Electronic Materials (e.g., AZ 421K), for example. For patterning of aluminum films, an Al etch can be performed for 45-75 seconds (e.g., about 1 minute) at from 30° C. to 60° C., and in one embodiment, about 45° C. (616). An aluminum etchant type D available from Transene Inc. (a conventional wet etchant) can be used to etch the exposed aluminum metal. Next, the photoresist can be stripped (618), e.g., for a length of time of from 8-12 minutes (in one example, about 10 minutes) at about 40° C. to 60° C. (in one example, about 50° C.) (618) and the flow can complete (620). A conventional photoresist stripper such as Kwik Strip, available from AZ Electronic Materials, can be used for stripping the photoresist, for example.

Laser exposure of suitable resists sensitized to the employed laser wavelength generally yields a resist pattern exposing underlying layers after development. Depending on the nature of the resist, a laser exposed area can be removed (i.e., a positive resist) or may remain (i.e., a negative resist) after the development step. After resist development, an exposed underlying layer may be etched, yielding (after an optional resist stripping step) a patterned semiconductor, gate dielectric, gate metal, interlayer dielectric and/or metal interconnect layer. The pattern in each of these layers can independently be customized and/or distinguished in different ICs by accordingly changing a laser exposure pattern of the resist.

Suitable resists include materials and/or formulations which can absorb the laser wavelength and change their solubility characteristics upon exposure, allow removal of the exposed (positive) or unexposed (negative) material in a development step, and withstand the conditions of etching the underlying layers. Preferably, the resist includes a conventional ultraviolet (UV) photoresist or thermal resist, as used in the semiconductor industry or in computer-to-plate (CTP) applications in the graphics arts printing industry, for example. Other suitable resist materials include polyimides (which may also absorb the wavelength of laser radiation), polymethyl methacrylate, and polydimethylglutarimide.

The resist may be sensitized to the laser wavelength by adding a suitable dye. For example, it has been demonstrated that conventional UV-sensitive (i-line) positive photoresist can be sensitized to and used with an 830 nm CTP laser tool by adding a suitable IR dye. It is believed that the radiation absorbed at 830 nm may be converted into heat, initiating a similar reaction as that observed with UV exposure, and yielding a solubility change in the exposed material.

This IR sensitized photoresist formulation can facilitate the use of an 830 nm CTP laser tool for resist patterning and etching of various device layers, particularly aluminum lines. Conventional thermal resists, as typically used in laser CTP applications, typically show relatively poor etch resistance to wet etchants employed to pattern aluminum layers at line width and space dimensions of less than 20 um. In contrast, a conventional UV photoresist sensitized to IR radiation by adding an IR dye not only showed good patterning capability (down to about 2 μm), but also excellent etch resistance to wet etchants for removing metal.

Resist deposition can use conventional coating and/or printing techniques (e.g. spincoating, slit-coating, extrusion coating, spray coating, inkjetting, gravure printing, flexographic printing, etc.). Developing and stripping the laser patterned resist can comprise treating the substrate having the patterned layer thereon with a conventional developer and/or stripper (e.g., by submersing the substrate therein). Preferably, the developer and stripper consist essentially of a formulation substantially free of alkali metals.

Figure 7:
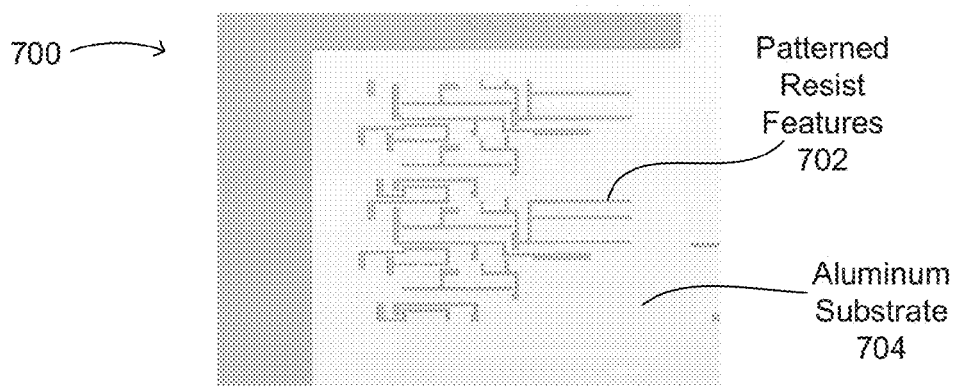
FIG. 7 is a top view diagram showing exemplary patterned resist features on an aluminum substrate in accordance with embodiments of the present invention.
Figure 8:
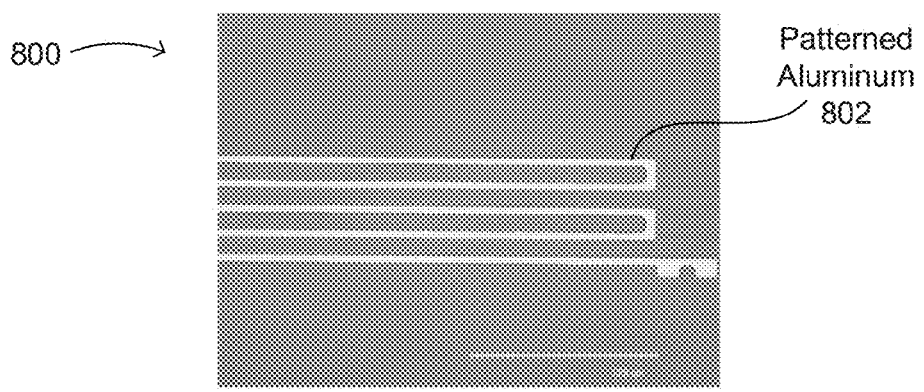
FIG. 8 is a top view diagram showing exemplary patterned aluminum after metal etch and resist strip in accordance with embodiments of the present invention.
Figure 9:
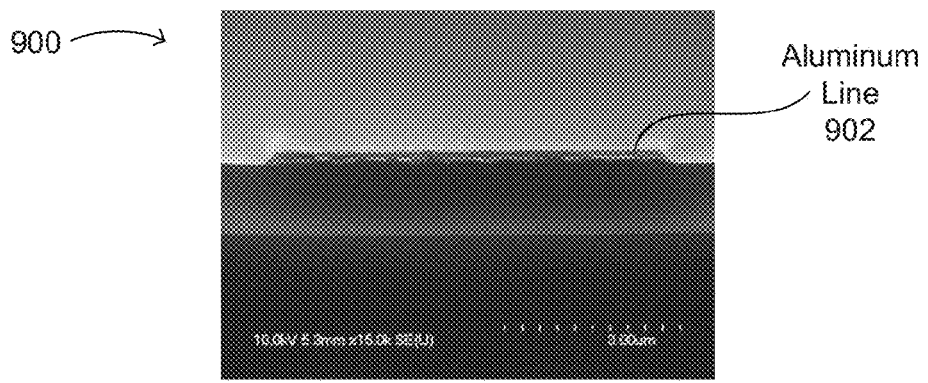
FIG. 9 is a cross-sectional view diagram showing an exemplary aluminum line after resist pattern, metal etch, and resist strip in accordance with embodiments of the present invention.

FIG. 7 is a picture 700 showing a top view of exemplary patterned resist features (702) on an aluminum substrate (704) in accordance with embodiments of the present invention. FIG. 8 is a picture 800 showing a top view of exemplary patterned aluminum lines (802) after metal etch and resist strip in accordance with embodiments of the present invention. FIG. 9 is a picture 900 showing a cross-sectional view of an exemplary aluminum line (902) after resist patterning, metal etching, and resist stripping in accordance with embodiments of the present invention. The results shown, particularly in FIGS. 8 and 9, demonstrate the feasibility of the present laser patterning method for patterning aluminum lines in commercial RF identification devices.

An Exemplary Method of Laser Patterning of Interlayer Dielectrics

Figure 10:
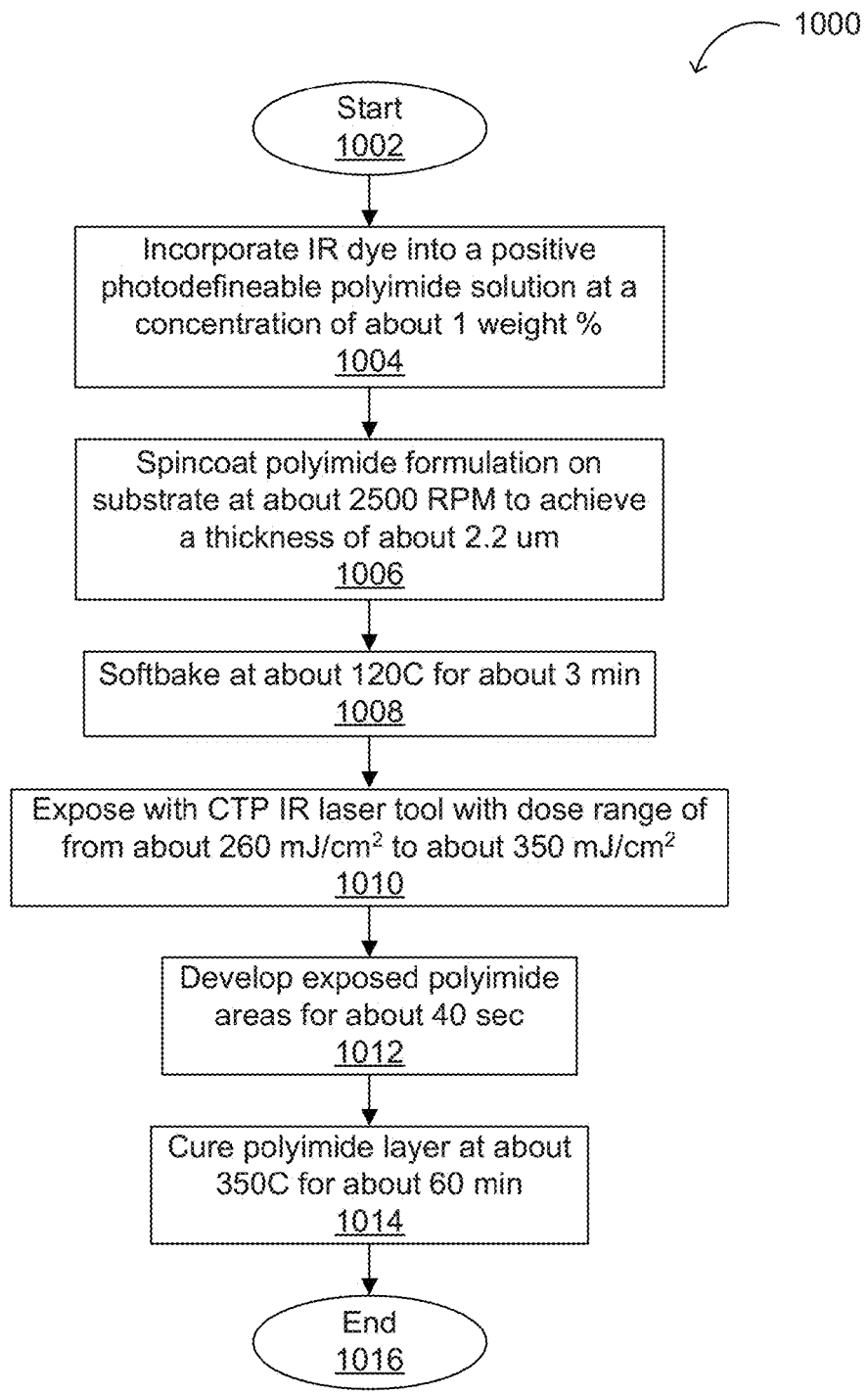
FIG. 10 is a flow diagram showing an exemplary method of laser patterning of an interlayer dielectric (ILD) layer in accordance with embodiments of the present invention.

An exemplary method of laser patterning of interlayer dielectrics (ILDs) in accordance with embodiments of the present invention is shown in FIG. 10 (general reference character 1000). The flow can begin (1002) and an IR dye can be incorporated into a solution of the dielectric at a concentration of from 0.1 to 10 wt. %, and in one embodiment, about 1 weight % (1004). The IR dye can be conventional (in one example, it was obtained from American Dye Source, product no. ADS815E), and the solution of dielectric may include a polyimide (in one example, obtained from HD Microsystems, product no. HD-8820), for example. Next, the dielectric (polyimide) formulation can be spincoated on a substrate at a rate of from 500 to 4500 RPM, and in one embodiment, about 2500 RPM to form a laser patternable dielectric coating. This coating may have a thickness of from 0.1 μm to 4 μm, and in one embodiment, about 2.2 μm (1006). Then, the structure can be heated at a temperature and for a length of time sufficient to remove substantially all of the solvent from the dielectric coating (a so-called "softbake" process) (1008). The temperature may be from about 90 to about 150° C., and in one embodiment, at about 120° C., for 30 seconds to about 6 minutes (in one example, about 3 minutes).

Next, the structure can be irradiated (exposed) with a CTP IR laser tool with a dose of radiation in the range of from 150 mJ/cm$^2$ to about 500 mJ/cm$^2$ (e.g., from about 260 mJ/cm$^2$ to about 350 mJ/cm$^2$) (1010). Then, the exposed dielectric areas can be developed for 20 to 80 seconds, and in one embodiment, about 40 seconds (1012). The developer used can be a conventional alkali- (e.g., KOH—) or alkali-free (e.g. TMAH-based) developer such a those available from AZ Electronic Materials (e.g., AZ 421K), for example. Next, the dielectric layer can be cured in an inert atmosphere at from 150 to 500° C., and in one embodiment, about 350° C., for from 10-120 minutes (in one example, about 60 minutes) (1014) and the flow can complete (1016).

Similar to laser patterning of resist, interlayer dielectrics (ILD) can be patterned by exposure to suitable laser radiation. After such exposure, the exposed (positive) or unexposed (negative) areas may be removed in a suitable developer (e.g. organic solvents, HF solutions, KOH or TMAH solutions, etc.). In contrast to laser resist patterning, areas exposed after resist development may not be etched, but the patterned ILD layer may be optionally cured in an oven, and then the ILD layer becomes part of the device structure. This approach lends itself to the patterning of via contact holes, examples of which will be shown below. Thus, the ILD pattern can independently be customized and distinguished in different ICs (e.g., RFID tags) by changing the laser exposure pattern of the ILD formulation for each tag in a given group of tags.

Suitable ILD materials can absorb the laser wavelength and change their solubility characteristics upon exposure, which can allow removal of the exposed (positive) or unexposed (negative) material in a development step, and also may provide suitable electrical characteristics (e.g., breakdown voltage, dielectric constant, thickness, leakage current, etc.) for an intended device application. Examples of possible materials suitable for use in accordance with embodiments of the present invention include polyimides, spin-on-glasses (SOG), benzocyclobutenes, silicones, fluoropolymers such as polytetrafluoroethylene, polyphenylquinoxaline, and other polymers typically employed for interlayer dielectrics.

ILD formulations which do not absorb the laser wavelength can be sensitized by adding a suitable dye to the formulation. For example, it has been found that a commercially available positive UV-sensitive polyimide formulation can be sensitized and laser patterned with an 830 nm CTP laser by adding an IR dye to the formulation. Further, it is believed that the radiation absorbed at 830 nm may be converted into heat, initiating a similar reaction to that observed in UV exposure and yielding a solubility change in the exposed material.

After laser exposure, the ILD layer may be developed with an aqueous alkali (e.g., KOH) solution, thereby removing material from the exposed regions, and the patterned polyimide layer may be cured at an elevated temperature. Via holes with dimensions as small as 2 μm have been fabricated in this fashion, and gate-via contacts with good yield and contact resistance were obtained, without adversely affecting the dielectric properties of the ILD.

In cases where adding a dye to the ILD formulation is not possible due to solubility/miscibility constraints, or if the dye addition affects the electrical performance of the ILD layer, patterning of the ILD formulation may be accomplished by depositing the dye on top of the deposited ILD layer before laser patterning. In such an embodiment, an ILD formulation (e.g., a SOG) may be deposited on a substrate (e.g., by spraying, spincoating, printing, etc.), and subsequently, a dye solution can be deposited (e.g., by spraying, spincoating, printing, etc.) on top of the spincoated ILD layer. Upon exposure, the radiation may be absorbed in the dye layer and converted to heat. The absorbed energy may be transferred to the underlying ILD by conventional heat transfer, thus changing the solubility of the underlying material. Using, for example, an SOG formulation as an ILD, the absorbed energy can locally cure the material, while the unexposed regions may remain soluble or show a relatively (and, preferably, substantially) increased dissolution rate in a suitable developer or etchant, as compared to the exposed area. After development and optional removal of the remaining dye layer, the patterned SOG layer may be cured at elevated temperature.

The interaction of the laser irradiation with the ILD layer may be affected by the absorbance, reflectivity and/or thermal properties of the ILD layer, as well as the underlying layers. As these properties change in patterned underlying layers across the substrate, it is preferable that the ILD formulation changes its solubility characteristics upon laser irradiation in the exposed areas (positive) to minimize these interactions. A positive acting ILD formulation may require that only a relatively small area of the device layer which may be positioned on top of a metal or silicon pad is actually irradiated.

ILD deposition may use conventional coating and printing techniques (e.g. spincoating, slit-coating, extrusion coating, spray coating, inkjetting, gravure printing, flexographic printing, etc.). Development can employ mostly conventional developers, preferably formulations that are substantially free of alkali metals.

Figure 11:
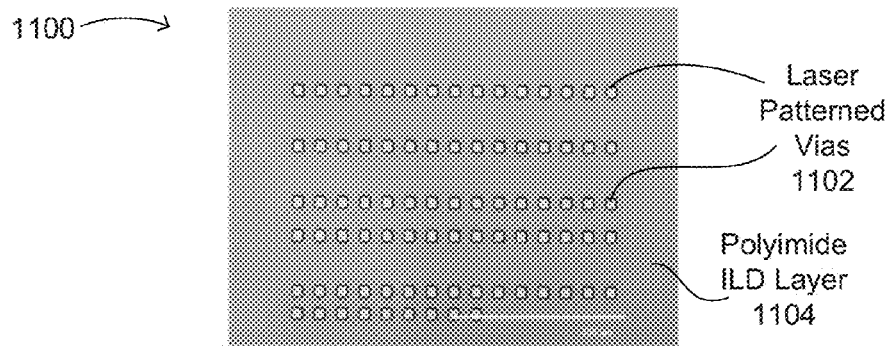
FIG. 11 is a top view diagram showing exemplary laser patterned vias in a polyimide ILD layer in accordance with embodiments of the present invention.
Figure 12:
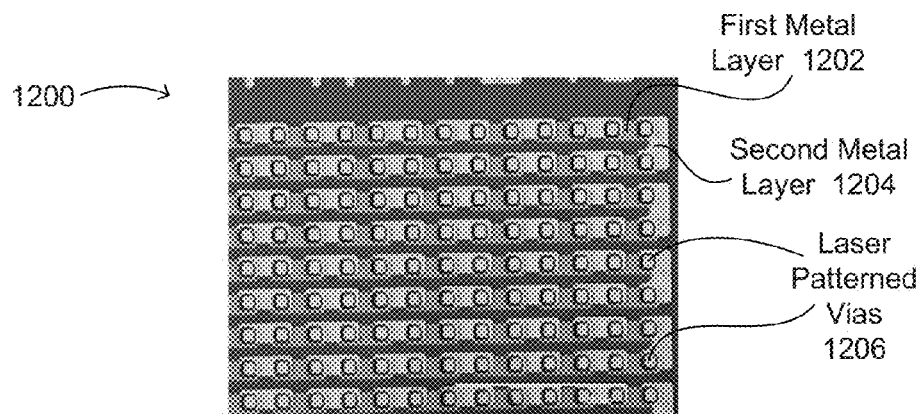
FIG. 12 is a top view diagram showing exemplary laser patterned via strings connecting two levels of metal in accordance with embodiments of the present invention.
Figure 13:
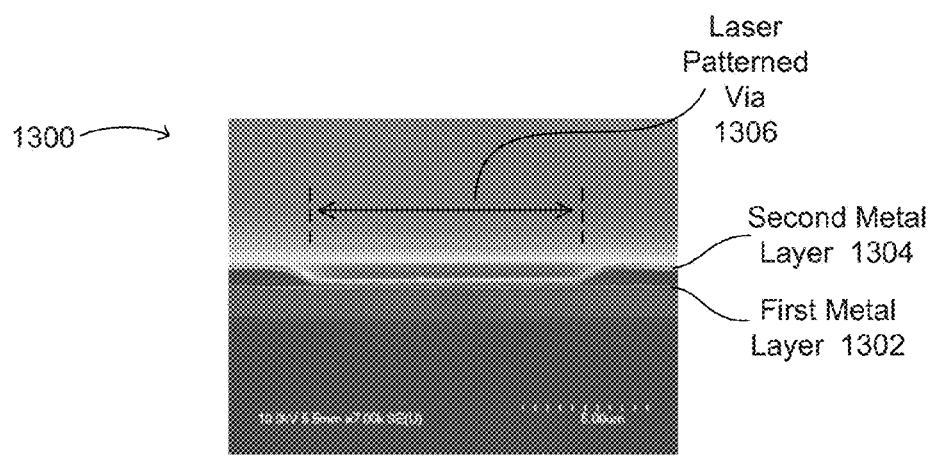
FIG. 13 is a cross-sectional view diagram showing an exemplary via connecting two levels of aluminum in accordance with embodiments of the present invention.

FIG. 11 is a picture 1100 showing a top view of exemplary laser patterned vias (1102) in a polyimide ILD layer (1104) in accordance with embodiments of the present invention. FIG. 12 is a picture 1200 showing a top view of exemplary laser patterned vias (1206) connecting two levels of metal (e.g., first metal layer 1202 and second metal layer 1204) in accordance with embodiments of the present invention. FIG. 13 is a picture 1300 showing a cross-sectional view of an exemplary via (1306) connecting two levels of aluminum (e.g., first metal layer 1302 and second metal layer 1304) in accordance with embodiments of the present invention. The results shown, particularly in FIGS. 12 and 13, demonstrate the feasibility of the present laser patterning method for patterning via structures in commercial RF identification devices.

An Exemplary Method of Laser Writing of (Metal) Gate and/or Interconnect Lines

Figure 14:
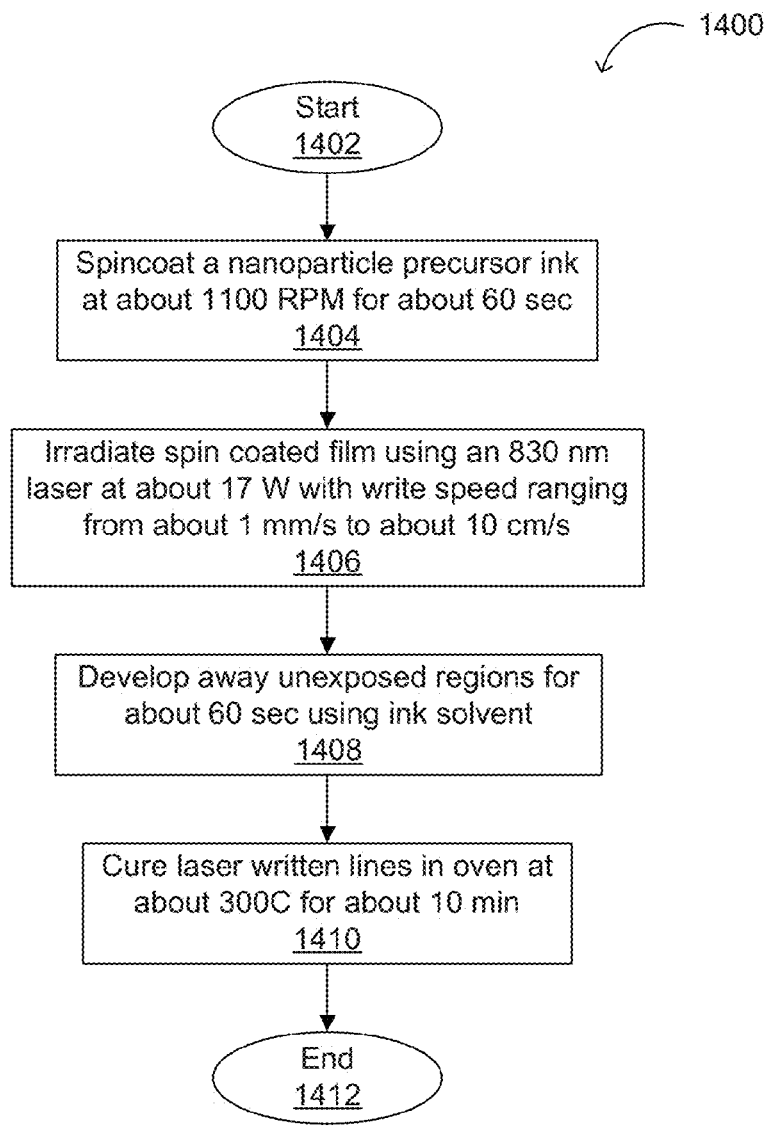
FIG. 14 is a flow diagram showing an exemplary method of laser direct writing of gate metal/interconnect layers in accordance with embodiments of the present invention.

An exemplary method of laser writing metal gate and/or interconnect lines in accordance with embodiments of the present invention is shown in FIG. 14 (general reference character 1400). While this aspect of the invention is described using a process for making a laser-patterned metal layer as an example, it will be recognized by those skilled in the art that this method is not limited to making patterned metals. Laser writing can also be used to pattern dielectrics, semiconductors, etc., as long as one uses a precursor ink that, upon laser exposure, is converted to a material that becomes part of the device structure (or that otherwise changes its solubility in a subsequent developer upon or following laser irradiation). In such cases, the precursor ink may absorb light or radiation at the laser wavelength employed (e.g., Ag or Au nanoparticles), or a dye may be added to or on a precursor material that does not otherwise absorb radiation at the wavelength employed.

Referring now to FIG. 14, and using a process for making a laser-patterned metal layer as an example, the flow can begin (1402), and a nanoparticle precursor ink can be spincoated on a substrate at a rate of from 200 to 2000 RPM, and in one embodiment, at about 1100 RPM for from 30 to 90 seconds (in one example, about 60 seconds) (1404). The precursor ink can comprise from 0.1 to 40 wt. %, and in one embodiment, about 20 wt. % of metal nanoparticles (e.g., Ag nanoparticles) in a solvent (e.g., n-butyl ether). Next, the spincoated film can be irradiated using an 830 nm laser at a power of from 10 to 30 W, and in one embodiment, about 17 W, with a write speed ranging from about 1 mm/s to about 10 cm/s (1406). Then, the unexposed regions can be developed (e.g., removed by washing or dissolving in a suitable solvent, such as the solvent in the precursor ink) for from 30 to 90 seconds, and in one embodiment, about 60 seconds (1408). The development liquids (e.g., the solvent or washings containing unexposed and/or unfused nanoparticles) can also be recycled, generally by collecting the development liquids, removing the solvent to recover the removed nanoparticles, and purifying the recovered nanoparticles. Next, and optionally, the laser written lines can be cured and/or annealed in an oven at from 100 to 500° C., and in one embodiment, about 300° C., for from 2 to 120 minutes (e.g., about 10 minutes) (1410) and the flow can complete (1412).

Patterning of metal gate and/or interconnect lines for customization can be achieved by: (i) depositing a metal precursor film; (ii) irradiating the metal precursor film with a laser, and thereby changing its solubility characteristics; (iii) removing the unexposed area (negative) or exposed area (positive) in a suitable developer or solvent; and optionally (iv) curing the patterned metal precursor to form a patterned metal layer. Alternative and/or additional description(s) of suitable methods of laser writing metal lines and/or gates may be found in U.S. patent application Ser. No. 11/203,563, filed on Aug. 11, 2005, the relevant portions of which are incorporated herein by reference. The gate and/or interconnect metal pattern can independently be customized and distinguished in different ICs (e.g., RFID tags) by changing the laser exposure pattern of the metal precursor film for a majority of tags (or, in one embodiment, each tag) in a given group of tags.

Metal precursors suitable for use in accordance with embodiments of the present invention can generally include metal nanoparticles, organometallic compounds and/or mixtures thereof, which can absorb the laser wavelength and change their solubility upon exposure, allow removal of the exposed (positive) or unexposed (negative) material in a development step, and provide suitable electrical characteristics (e.g., conductivity, electromigration resistance, etc.) after an optional curing and/or annealing step.

Metal precursors suitable for use in accordance with embodiments of the present invention can include nanoparticles or organometallic compounds of Ag, Al, Pd, Rh, Cu, Pt, Ni, Fe, Ru, Os, Mn, Cr, Mo, Au, W, Co, Ti, Ir, Zn and Cd. The nanoparticles or ink formulations thereof may further include one or more surfactants to help their solubility and/or dispersability in the solvent(s). Typical surfactants can include thiols, carboxylic acids, amines, ethers, phosphines, phosphine oxides, and corresponding multifunctional versions thereof, etc. Organometallic compounds can carry ligands, such as carboxylates, perfluorocarboxylates, alkoxides, beta-diketonates, perfluorinated derivatives thereof, thiolates, amines, amides, phosphines, phosphine oxides, hydrides, carbonyl, cyclopentadienyl, alkyl, aryl, alkene and alkyl, and others. Typical solvents for the metal precursors can include aliphatic and aromatic hydrocarbons, ethers, fluorocarbons, pyridine, alcohols, ketones, water, etc.

Furthermore, one or more semiconductor precursor layers (e.g., containing doped and/or undoped silicon or silicon-germanium) can be printed from an ink (e.g., the "silicon ink" described above) comprising silicon and/or germanium nanoparticles and/or a liquid-phase silane, germane and/or silagermane in a suitable solvent. For example, the silane, germane or silagermane may have the formula $A_xH_y$, where each A is independently Si or Ge (preferably Si), x is from 3 to 1000

(preferably from 4 to 20, or 5 to 10) and where x may be derived from an average number molecular weight of the silane, germane and/or silagermane when x≥10 or 20, and y is from x to (2x+2) (preferably 2x). Preferred solvents for the semiconductor precursor ink include cycloalkanes such as cyclohexane, cyclooctane, decalin, etc. Metal layers may be printed from an ink comprising nanoparticles of a metal (such as silver, copper, gold, palladium, molybdenum, aluminum, etc.) in a suitable solvent. Preferred solvents for the metal precursor ink include saturated, unsaturated, aromatic and halogenated hydrocarbons, ethers, polyethers, esters, amines, amides, alcohols, glycols, thiols, lactones, phosphates, nitriles, silanes, silicones, sulfoxides, fatty acids, ketones, terpenes, and terpineols. More specific examples of suitable organic ink solvents include mineral spirits, toluene, xylene (s), mesitylene(s), tert-butyltoluene, 1-dodecene, 1-decene, 1-octene, dodecane, pyridine, cycloalkanes such as cyclohexane, cyclooctane, indane, tetralin and decalin, cyclohexylbenzene, tetralin, 3-octanol, 2-ethylhexanol, dibutyl ether, alpha-terpineol, dyhydroterpineol, cyclohexanone, ethyl lactate, cyclomethicones, propylene glycol monomethyl ether, gamma-butyrolactone, dihydrobenzofuran, 1-heptanol, 2-methyl-2,4-pentanediol, phenethyl alcohol, citronellol, geraniol, diethylene glycol monomethyl ether, diethylene glycol monomethyl ether, phenetole, diethyl phthalate, diglyme, triglyme, tetraglyme, combinations thereof, etc., particularly dibutyl ether and terpineols.

The metal precursor formulation can intrinsically be sensitive to the laser wavelength used, or alternatively, a dye absorbing at that wavelength may be added to the formulation. For example, films of Ag nanoparticles of about 4 nm size show sufficient absorption at the wavelength of 830 nm of a CTP laser printer that the Ag nanoparticles are converted to Ag metal upon laser irradiation. Here, the Ag nanoparticles can constitute both the metal precursor and the dye.

Alternatively, for metal precursor formulations which do not absorb sufficiently at the laser wavelength, a suitable dye may be added to the formulation. In another embodiment, the dye may be deposited before the deposition of the metal precursor film (e.g., the dye may be below the metal precursor film) or after the deposition of the metal precursor (e.g., the dye may be on top of the metal precursor film). In either case, the dye can absorb the laser energy and convert it into heat, resulting in a solubility change of the adjacent metal precursor film.

The solubility change of the metal precursor upon laser irradiation can be induced by: (A) converting the metal precursor to metal in the irradiated areas by fusing metal nanoparticles and/or decomposing the organometallic compound; (B) crosslinking the metal precursor species; or (C) decomposing a protective group or dissolution inhibitor present in the metal precursor film by the absorbed energy.

In version (A), the metal precursor or an additional dye can absorb the laser energy and convert it into heat, causing removal of the surfactants and/or ligands, and/or fusing of nanoparticles and/or organometallic compounds to form metal in the exposed areas. After exposure, the remaining unexposed metal precursor film may be removed by washing in a suitable developer (e.g., the ink solvent). The recovered development liquids (e.g., containing a solution or suspension of nanoparticles) can also be recycled as described above. After development, the patterned metal layer may optionally be annealed in a conventional oven to improve its characteristics (e.g., conductivity, electromigration resistance, morphology, adhesion, etc.).

It has been found that adding certain compounds to the metal precursor formulation dramatically increases its sensitivity to metal formation upon laser irradiation, and as a result, may reduce the required laser power and/or increase the speed with which the laser patterning can be performed. For example, adding 0.5 wt % of $Sn(O_2CC_xH_{2x+1})_4$, where $4 \leq x \leq 20$ (e.g., tin ethylhexanoate) to a silver (Ag) nanoparticle ink formulation (20 wt % in dibutyl ether) increased the speed by which the Ag nanoparticle film could be laser patterned by about two times (up to 2 cm/s or more). Metal precursor formulations with increased sensitivity can accordingly increase the laser tool throughput.

In version (B), the metal precursor formulation can contain compounds with functional groups, which upon laser irradiation, can cause a crosslinking reaction. As the material in the laser irradiated areas is crosslinked, its solubility in solvents (e.g., the ink solvent) may be greatly reduced. The unexposed metal precursor film can subsequently be removed in a development step using the ink solvent, for example. The developed or washed away nanoparticles can also be recycled, as described above. The patterned metal precursor film may then be cured in a conventional oven to convert the film to a patterned metal layer.

Functional groups suitable for crosslinking reactions in accordance with embodiments of the present invention can include vinyl, allyl, epoxides, acrylates, vinyl ketones, oxiranes, and others. These functional groups may be present in the metal precursor formulation as part of the metal precursor, such as nanoparticle surfactants with terminal vinyl groups, or compounds carrying such groups, may be added to the metal precursor formulation as a "binder." Additionally, the metal precursor formulation may contain initiators which can promote the crosslinking reaction upon laser exposure.

In version (C), the metal precursor formulation may contain compounds which upon laser irradiation decompose and/or react to increase the solubility of the exposed material in solvents in which the metal precursor formulation would not otherwise be soluble therein. After exposure, the irradiated area may be removed in a suitable developer and the remaining patterned metal precursor film can be conventionally cured to form a patterned metal layer, for example.

Such a solubility reversal can be initiated by the decomposition of functional groups, such as carbonates and carbamates which may act as protecting groups for alcohols/phenols and amines, respectively. For example, in an initial or protected state, the metal precursor formulation may not be soluble at all, or it may be only poorly soluble, in aqueous bases or acids. On the other hand, after laser irradiation and removal of the protecting group, the alcohol, phenol or amine functionality can be revealed, thus imparting a high solubility of the irradiated material in aqueous bases or acids. Such functional groups may be present in the metal precursor formulation as part of the metal precursor, such as nanoparticle surfactants with terminal t-butoxycarbonyl groups, or compounds carrying such groups may be added to the metal precursor formulation as a "dissolution inhibitor."

In addition, the formulation as described above may contain compounds acting as acid generators upon laser exposure (e.g., a so-called "photoacid generator," or PAG), which can promote the removal of the protecting group. Further, metal precursor deposition may use conventional coating and printing techniques (e.g. spincoating, slit-coating, extrusion coating, spray coating, inkjetting, gravure printing, flexographic printing, etc.). Also, development can employ most typically liquids in which the metal precursor or the irradiated metal precursor is soluble, such as organic solvents, aqueous acids or bases, etc.

Figure 15:
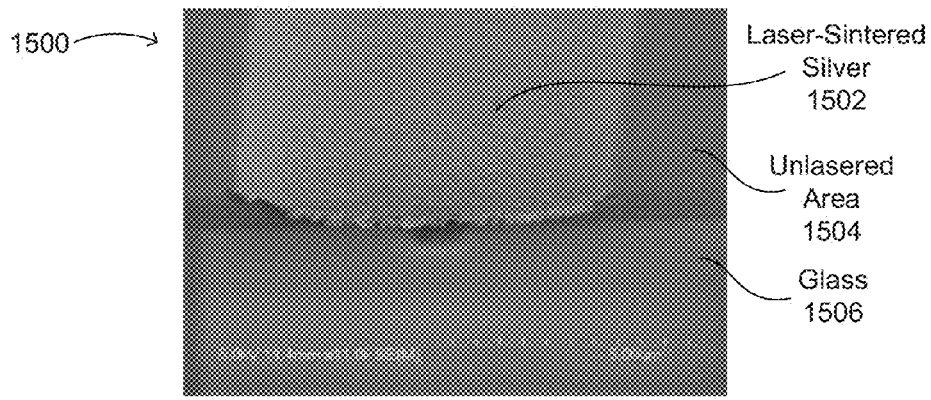
FIG. 15 is a cross-sectional view diagram showing a laser irradiated nanoparticle film in accordance with embodiments of the present invention.

FIG. 15 is a picture 1500 showing a cross-sectional view of a laser irradiated nanoparticle film in accordance with embodiments of the present invention. Laser-sintered Ag 1502 can be distinguished from unlasered area 1504, each over glass 1506.

The throughput of a low cost process flow should be as high as possible, so optimization of the speed at which the nanoparticle films can be written is also desired. Further, use of additives, such as Sn- and Ni-based additives (e.g., surfactants and/or sensitizers), may be expected to improve the speed at which these lines can be written.

Figure 16:
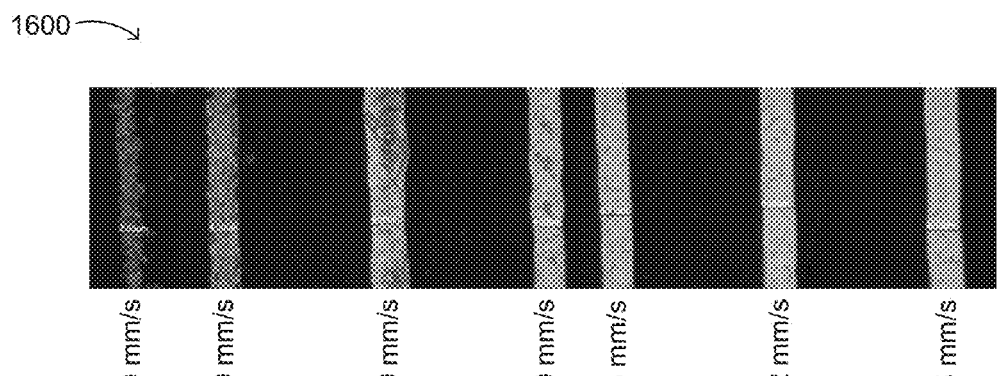
FIG. 16 is a top view diagram showing exemplary metal lines laser written at varying speeds and developed using a control nanoparticle ink with palladium additive in accordance with embodiments of the present invention.
Figure 17:
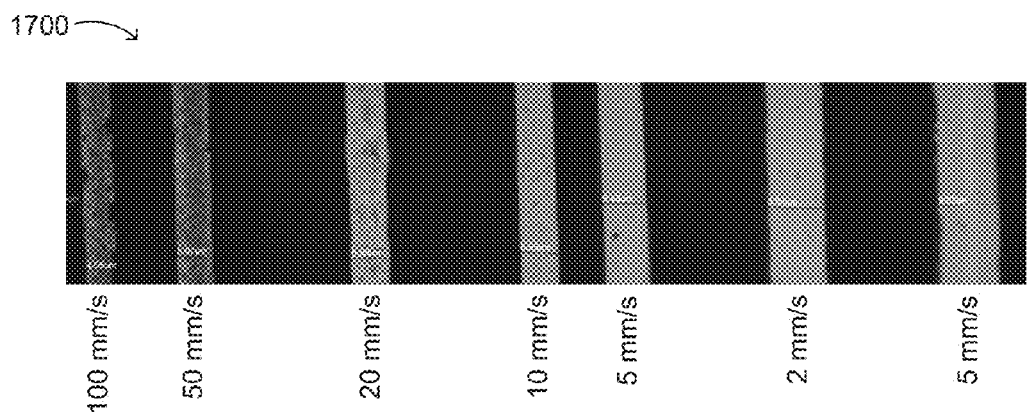
FIG. 17 is a top view diagram showing the exemplary metal lines of FIG. 16 after adding Sn or Ni ethylhexanoate to the nanoparticle ink in accordance with embodiments of the present invention.

FIG. 16 is a picture 1600 showing a top view of metal lines laser written at varying speeds using a control nanoparticle ink with a palladium additive, then developed in accordance with embodiments of the present invention. As the speed of the written line is increased from right to left, the morphology of the laser-written film degrades. However, after adding Sn or Ni ethylhexanoate to the nanoparticle ink, the morphology of the faster written lines improves, as shown in FIG. 17 (general reference character 1700). The results shown demonstrate the feasibility of the present laser writing method for patterning interconnect lines in commercial RF identification devices.

An Exemplary RFID Laser Customization for Security/Encryption Features

An exemplary method of customizing identification devices in accordance with embodiments of the present invention can include: (a) forming a pattern on one of the identification devices using laser patterning; (b) forming a different pattern on another of the identification devices using laser patterning; and (c) repeating step (b) such that a majority (and in one embodiment, each) of the identification devices contains a unique identifier. The patterns can include metal (e.g., aluminum) and/or via patterns, as well as any other material (e.g., silicon) suitable for exposure using a patternable resist, for example. Further, the unique identifier can also include a local key for security or encryption features.

Figure 18:
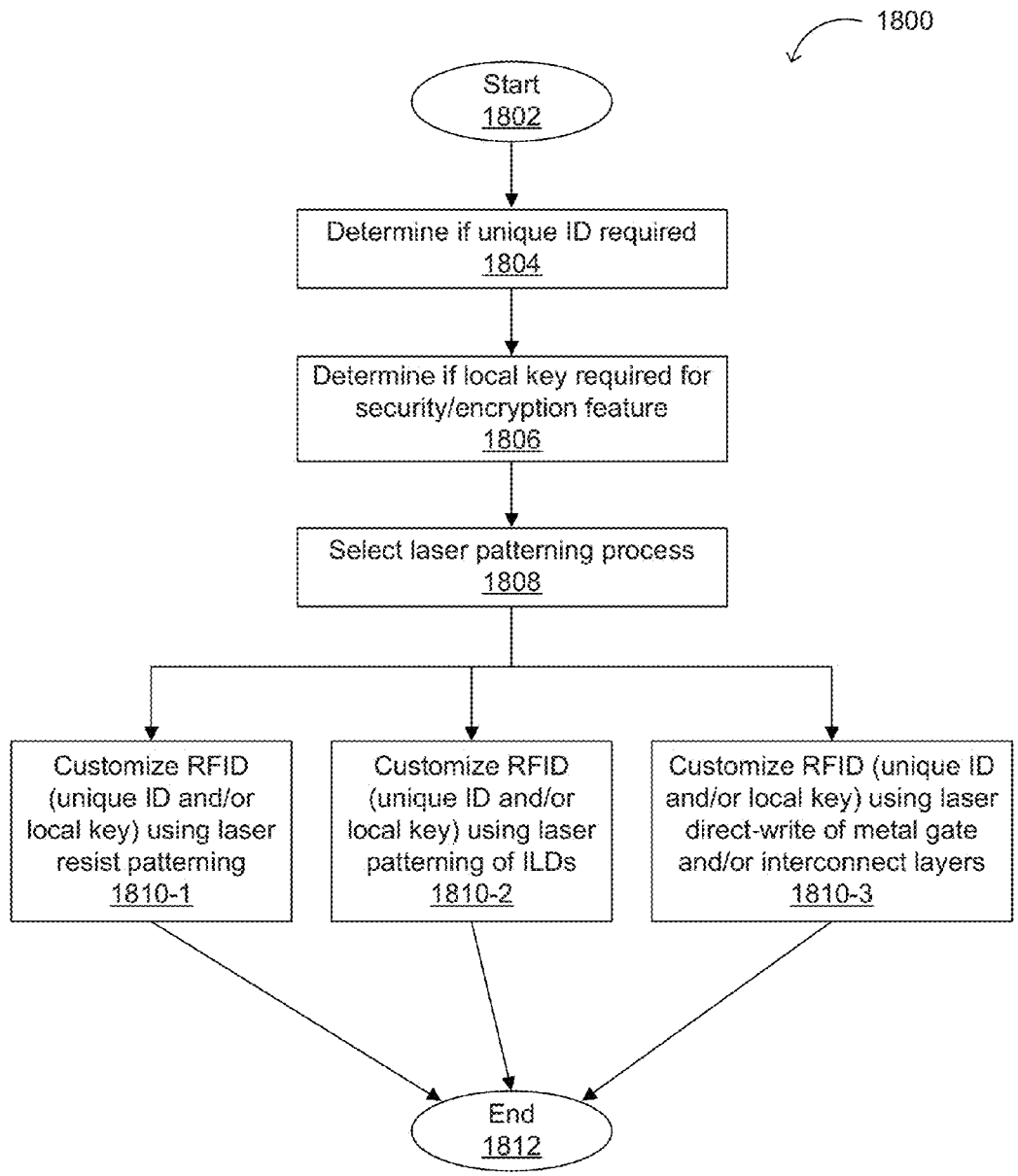
FIG. 18 is a flow diagram showing an exemplary method of RFID customization in accordance with embodiments of the present invention.

As shown in FIG. 18, an exemplary method of laser customization 1800 in accordance with embodiments of the present invention can include: (i) determining if a unique identification is required; (ii) determining if a local key is required for a security/encryption feature; and (iii) selecting a laser patterning process. As discussed above, laser patterning processes and/or methods suitable for RFID customization in accordance with embodiments of the present invention can include laser resist patterning, laser patterning of ILDs, and/or laser direct-write of metal gate and/or interconnect layers. Thus, alternatively, the method may comprise (1) identifying a material to be uniquely patterned for each device in a group of devices; then (2) laser patterning the material according to its laser patternability.

In FIG. 18, the flow can begin (1802) and it can be determined whether a unique ID is required (1804). Generally, this step is determined in design of a product (e.g., an RFID tag) and/or its production/manufacturing flow, or in manufacturing (e.g., immediately prior to or at the beginning of the step of patterning a customizable layer in the tag) after the product design and process flow definition are complete. Next, it can be determined if a local key is required for a security/encryption feature (1806), as will be discussed in more detail below. Next, one of the laser patterning processes can be selected (1808), generally depending on the material being laser patterned. Suitable methods can include laser resist patterning (1810-1), laser patterning of ILDs (1810-2), and/or laser direct-write of metal gate and/or interconnect layers (1810-3). For example, laser resist patterning (1810-1) may be selected when the material to be patterned does not change its solubility characteristics upon (selective) irradiation with the laser. ILD laser patterning (1810-2) may be selected when the material to be patterned is a dielectric that changes its solubility characteristics upon (selective) irradiation with the laser. Laser direct-writing (1810-3) may be selected when the material to be patterned is a metal or other conductor that changes its solubility characteristics upon (selective) irradiation with the laser. Thereafter, the flow can complete (1812).

RFID tags and systems are being increasingly used in high security applications, such as access systems and systems for making payments or issuing tickets, for example. These applications may necessitate the use of security measures, including authentication protocols which may work by checking knowledge of a cryptographic key. The lack of a suitable and robust security/authentication protocol can lead to devastating consequences if the manipulated RFIDs are used to gain access to services without proper authorization. Further, newer RFID applications, such as supply chain and item-level tagging, may also require security/authentication measures. Accordingly, there is an increasing need to develop low cost security/encryption techniques suitable for use in RFID systems.

In some conventional approaches, security/encryption may be provided in RFID systems and/or applications by using a combination of authentication using derived keys and encrypted data transfer. The keys may be used to "cryptologically" encrypt the transmitted data stream. Typically, during production of a transponder IC (e.g., an RFID), a serial number of the IC may be read out. A local key (e.g., a predetermined bit string value that is unique to a particular RFID tag) can then be derived using a cryptological algorithm and a user-defined master key. The transponder IC may have adequate on-chip memory allocated for the local key to be initialized within the transponder IC. The memory type used for this initialization may include a non-volatile memory type, such as OTP, EEPROM, FRAM, etc. This local key may be linked to an ID number of a particular RFID tag and to the master key. Due to the relatively high cost of initializing or implementing the local key storage in mask-based ROM or one of the above non-volatile memory types, a preferred memory type may be another non-volatile form. Of course, when only a relatively small number of bits are to be allocated for a particular application, the cost of any associated non-volatile memory may not be prohibitive. Further, the process/manufacturing technology used may also affect such cost estimates.

To prevent access to this local key, a manufacturer may provide a configuration register or equivalent for write protecting the selected address space in the memory. This is to prevent unauthorized access to the specific locations within the memory portion of the transponder. This local key may then be used for mutually authenticating the transponder with the required reader in a given application, such that only authorized readers may access a given RFID device.

In other conventional approaches, a transponder circuit may have a pseudorandom number generator that is used to encrypt the transmitted data. This pseudorandom number generator can typically be realized by state machines with feedback shift registers. However, such circuitry also contributes to the cost of the transponder IC. Hence, such conventional schemes for encryption/security can require the use of relatively expensive memory, as well as additional logic blocks, which take up more area. Accordingly, such approaches may not be preferred in certain applications where cost is an important criterion.

The use of laser customization, as discussed above, can overcome these issues for cost-sensitive applications. The local key can be generated and hard-wired into the RFID tag (e.g., in the memory and/or logic) during the production process at substantially the same time as writing the unique (serial) ID. This can result in significantly lower overall costs, as compared to programming the local key using EEPROM, for example. Furthermore, unique random numbers can be printed into the RFID to provide the encryption for data transfer. These unique random numbers can be computed using known algorithms and customized into each tag in a group of tags as per the specific requirements of the end-user. Accordingly, embodiments of the present invention can reduce the complexity and associated cost of design, fabrication, test, and programming, while providing an adequate level of security/authentication required for cost sensitive applications.

An Exemplary Method of Operating a Tag Device

An exemplary method of operating an RFID device in a wireless communication system can include the steps of: (i) programming an identifier and/or local key in the RFID device using a laser patterning technology; (ii) transmitting a bit string based on the identifier to a reader when an electromagnetic field is applied to the RFID device; and (iii) silencing the device for a predetermined time period. The laser patterning technology, processes and/or methods suitable for RFID customization in accordance with embodiments of the present invention can include laser resist patterning, laser patterning of ILDs, and/or laser direct-write of metal gate and/or interconnect layers, as discussed above.

Figure 19:
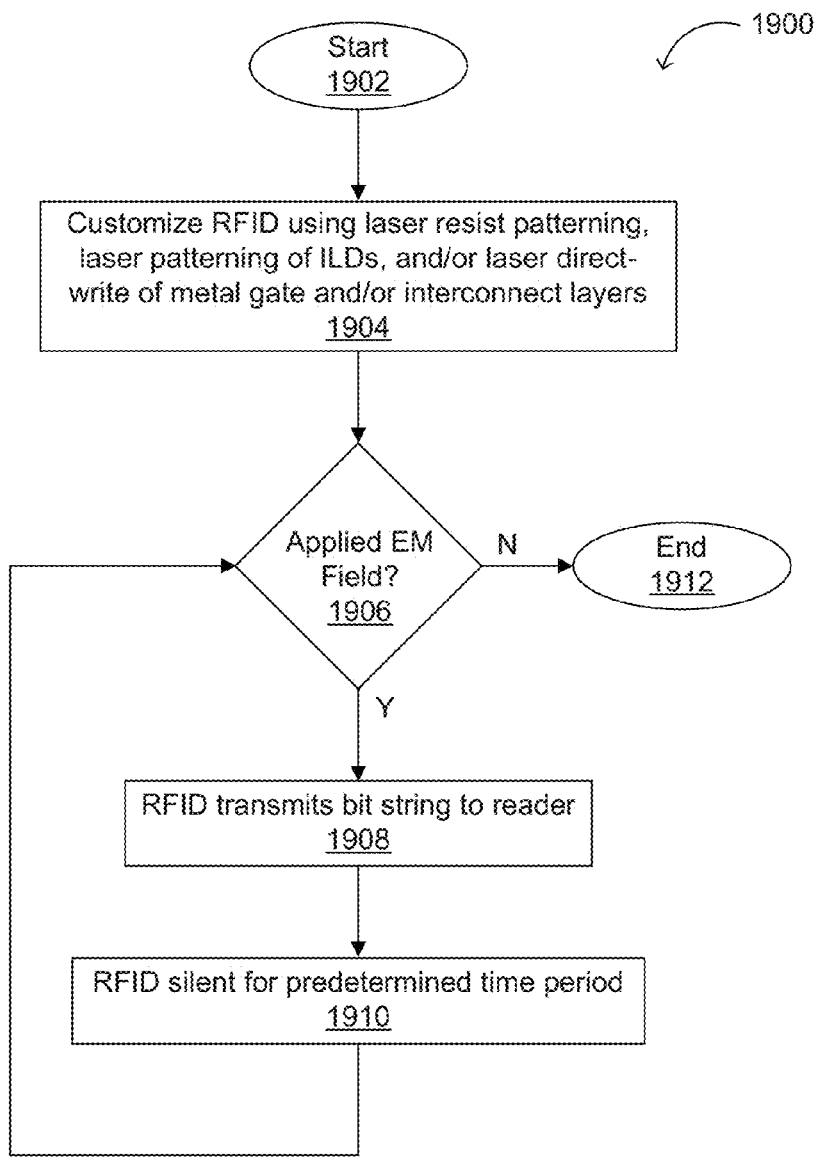
FIG. 19 is a flow diagram showing an exemplary method of customized RFID operation in accordance with embodiments of the present invention.

Referring now to FIG. 19, a flow diagram showing an exemplary method of customized RFID operation in accordance with embodiments of the present invention is indicated by the general reference character 1900. The flow can begin (1902) and the RFID tag (or each tag in a group of tags) can be customized (1904) using laser resist patterning, laser patterning of ILDs, and/or laser direct-writing of metal gate and/or interconnect layers.

If no electromagnetic (EM) field is applied (1906), the customized RFID tag returns or transmits no information to a reader, and the flow can complete (1912). However, as long as an EM field is applied (1906), the customized RFID tag can transmit or broadcast a bit string to the reader (1908), and the RFID tag can subsequently remain silent for a predetermined time period (1910). The bit string transmission, followed by a silent period, can repeat until the EM field is no longer applied. Further, as discussed above, different RFID devices or tags in a system can each have unique identifiers (e.g., bit strings for transmission in an EM field) that can be used to differentiate between those tag devices by an associated reader. Also, encryption/security features can be implemented (e.g., a local key) using the present laser patterning customization technique(s), as discussed above.

While the above examples include particular implementations of RFID device circuitry, structures, and processing methods, one skilled in the art will recognize that other technologies may also be used in accordance with embodiments. Further, one skilled in the art will recognize that other forms of processing, customization, and/or encryption or security techniques may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A plurality of identification devices, each of the plurality of identification devices comprising:
   a) a metal layer, a dielectric layer, and a semiconductor layer on a substrate, and
   b) an antenna attached to the identification device formed in the substrate;
   wherein:
   each of the plurality of identification devices is configured to receive a first wireless signal, demodulate said first wireless signal, perform control and readout functions, modulate a second wireless signal and broadcast said second wireless signal, and:
   a first one of said plurality of identification devices includes a first pattern in a material selected from the group consisting of said metal layer, said dielectric layer, and said semiconductor layer; and
   next ones of said plurality of identification devices includes a different pattern in a same material as said first pattern, such that at least a majority of said plurality of identification devices contains a unique pattern in said same material in which said first pattern is formed, wherein said first pattern, said different pattern and said unique pattern encode a bit string or signal pattern.

2. The plurality of identification devices of claim 1, wherein said unique pattern comprises a patterned metal layer.

3. The of claim 2, wherein the patterned metal layer comprises Ag, Al, Pd, Rh, Cu, Pt, Ni, Fe, Ru, Os, Mn, Cr, Mo, Au, W, Co, Ti, Ir, Zn, and/or Cd.

4. The plurality of identification devices of claim 1, wherein said unique pattern comprises a patterned semiconductor layer.

5. The plurality of identification devices of claim 1, wherein said unique pattern comprises a via pattern in a dielectric layer.

6. The plurality of identification devices of claim 5, wherein the dielectric layer comprises a photopatternable dielectric.

7. The plurality of identification devices of claim 6, wherein the photopatternable dielectric comprises a curable dielectric material and a light-absorbing dye therein.

8. The plurality of identification devices of claim 1, each identification device comprising a memory, clock circuitry, and logic in communication with said memory and said clock circuitry.

9. The plurality of identification devices of claim 8, wherein said unique pattern is in said memory and/or said logic, and said memory and/or said logic are configured to provide or generate said unique identifier.

10. The plurality of identification devices of claim 9, wherein each identification device further comprises power conversion circuitry configured to convert a signal having a characteristic frequency to an electric potential.

11. The plurality of identification devices of claim 10, wherein the antenna is configured to receive said signal having said characteristic frequency and provide said signal having said characteristic frequency to said clock circuitry and to said power conversion circuitry.

12. The plurality of identification devices of claim 1, wherein said encode a bit string or signal pattern unique identifier comprises a unique bit stream, and each of said plurality of identification devices further comprise a modulator configured to receive said bit stream from said logic circuitry.

13. The plurality of identification devices of claim 1, wherein the plurality of identification devices are each one of the group consisting of an electronic article surveillance (EAS) device, a radio frequency (RF) device, a high frequency (HF) device, and an ultra high frequency (UHF) device.

14. The plurality of identification devices of claim 13, wherein said plurality of identification devices comprise radio frequency identification devices (RFIDs).

15. The plurality of identification devices of claim 1, wherein each of the first pattern, the different pattern, and the unique pattern is configured to provide a unique identifier.

16. The plurality of identification devices of claim 15, wherein the unique identifier comprises a local security key, the local security key comprising a predetermined bit string that is unique to a particular identification device.

17. The plurality of identification devices of claim 1, wherein each of the plurality of identification devices has a length of from 2 to 20 mm and a width of from 5 to 20 mm.

18. The plurality of identification devices of claim 1, wherein each of the plurality of identification devices has an area of from 10 to 50 $mm^2$.

* * * * *